(12) United States Patent
Jang et al.

(10) Patent No.: US 9,832,917 B2
(45) Date of Patent: *Nov. 28, 2017

(54) ELECTROMAGNETIC WAVE ABSORBING SHEET AND METHOD OF MANUFACTURING THE SAME AND ELECTRONIC DEVICE USING THE SAME

(71) Applicant: AMOSENSE CO., LTD., Cheonan-si (KR)

(72) Inventors: Kil Jae Jang, Seongnam-si (KR); Dong Hoon Lee, Yongin-si (KR); Ki Chul Kim, Incheon (KR)

(73) Assignee: AMOSENSE CO., LTD., Cheonan-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/652,960

(22) PCT Filed: Dec. 27, 2013

(86) PCT No.: PCT/KR2013/012307
§ 371 (c)(1),
(2) Date: Jun. 17, 2015

(87) PCT Pub. No.: WO2014/104816
PCT Pub. Date: Jul. 3, 2014

(65) Prior Publication Data
US 2015/0342099 A1  Nov. 26, 2015

(30) Foreign Application Priority Data

Dec. 27, 2012 (KR) .................. 10-2012-0155203

(51) Int. Cl.
*H01F 1/34* (2006.01)
*H01Q 1/52* (2006.01)
(Continued)

(52) U.S. Cl.
CPC .............. *H05K 9/0075* (2013.01); *B32B 7/12* (2013.01); *B32B 15/04* (2013.01); *H01F 1/16* (2013.01);
(Continued)

(58) Field of Classification Search
None
See application file for complete search history.

(56) References Cited

U.S. PATENT DOCUMENTS 4,647,714 A * 3/1987 Goto .................... H05K 9/0003
174/36
5,639,989 A * 6/1997 Higgins, III .......... H01L 23/552
174/386

(Continued)

FOREIGN PATENT DOCUMENTS

KR   1020030086122   11/2003
KR   1020040046543   6/2004
(Continued)

OTHER PUBLICATIONS

Derwent abstract of WO 2011-142565 A2 (pub. 2011).*
International Search Report—PCT/KR2013/012307 dated May 8, 2014.

*Primary Examiner* — Kevin M Bernatz
(74) *Attorney, Agent, or Firm* — Cantor Colburn LLP

(57) ABSTRACT

Provided are an electromagnetic wave absorbing sheet which is a thin film and a low cost and has an excellent electromagnetic wave absorbing rate, a method of manufacturing the same, and an electronic device using the same. The electromagnetic wave absorbing sheet includes: at least one layer thin-film magnetic sheet which is separated into a plurality of fine pieces; a protective film that is adhered on (Continued)

one surface of the thin-film magnetic sheet; and a double-sided tape that is adhered on the other surface of the thin-film magnetic sheet.

10 Claims, 15 Drawing Sheets

(51) Int. Cl.
   *H05K 9/00* (2006.01)
   *H01F 1/16* (2006.01)
   *H01Q 17/00* (2006.01)
   *B32B 7/12* (2006.01)
   *B32B 15/04* (2006.01)
(52) U.S. Cl.
   CPC ............... *H01Q 1/52* (2013.01); *H01Q 17/00* (2013.01); *H05K 9/0081* (2013.01); *B32B 2307/208* (2013.01); *B32B 2307/702* (2013.01); *B32B 2307/704* (2013.01); *H01F 1/34* (2013.01); *Y10T 156/10* (2015.01); *Y10T 428/25* (2015.01); *Y10T 428/26* (2015.01); *Y10T 428/2804* (2015.01); *Y10T 428/2848* (2015.01); *Y10T 428/32* (2015.01)

(56) References Cited

U.S. PATENT DOCUMENTS

| | | | |
|---|---|---|---|
| 8,268,092 B2* | 9/2012 | Yang | G06K 19/07771 148/120 |
| 8,840,800 B2* | 9/2014 | Suetsuna | C22C 29/12 252/62.55 |
| 9,252,611 B2* | 2/2016 | Lee | H01F 38/14 |
| 9,392,735 B2* | 7/2016 | Jang | B32B 27/08 |
| 9,480,192 B2* | 10/2016 | Jang | B32B 7/06 |
| 9,507,390 B2* | 11/2016 | Jang | H05K 9/0075 |
| 9,578,792 B2* | 2/2017 | Jang | H05K 9/0086 |
| 2002/0074144 A1* | 6/2002 | Watanabe | H01L 23/552 174/394 |
| 2004/0219328 A1* | 11/2004 | Tasaki | C22C 30/00 428/692.1 |
| 2005/0003079 A1* | 1/2005 | Wakayama | B32B 27/36 427/129 |
| 2006/0038630 A1* | 2/2006 | Kawaguchi | H01F 1/00 333/12 |
| 2006/0099403 A1* | 5/2006 | Johnson | H01L 23/3733 428/323 |
| 2007/0047278 A1* | 3/2007 | Yamamoto | H01L 23/49582 363/144 |
| 2007/0252771 A1* | 11/2007 | Maezawa | G06K 19/07771 343/841 |
| 2008/0070003 A1* | 3/2008 | Nakatani | G06K 19/07749 428/141 |
| 2009/0167623 A1* | 7/2009 | Tsujimura | H01Q 1/2225 343/787 |
| 2009/0314411 A1* | 12/2009 | Kawaguchi | H01F 10/08 156/60 |
| 2009/0324982 A1* | 12/2009 | Aramaki | B22F 7/04 428/548 |
| 2010/0052992 A1* | 3/2010 | Okamura | H01Q 1/526 343/700 MS |
| 2010/0060538 A1* | 3/2010 | Suetsuna | H01F 1/33 343/787 |
| 2011/0037897 A1* | 2/2011 | Chen | H04B 1/082 348/565 |
| 2011/0217543 A1* | 9/2011 | Suetsuna | B32B 5/16 428/323 |
| 2013/0140076 A1* | 6/2013 | Lee | H01Q 17/002 174/391 |
| 2013/0202848 A1* | 8/2013 | Kim | H01B 7/421 428/141 |
| 2014/0017486 A1* | 1/2014 | Yoo | B29C 67/0011 428/325 |
| 2015/0123604 A1* | 5/2015 | Lee | H01F 38/14 320/108 |
| 2016/0064814 A1* | 3/2016 | Jang | H01Q 1/526 343/842 |
| 2016/0106012 A1* | 4/2016 | Jang | H05K 9/0086 361/679.26 |

FOREIGN PATENT DOCUMENTS

| | | |
|---|---|---|
| KR | 1020040063911 | 7/2004 |
| KR | 1020050037015 | 4/2006 |
| KR | 100623518 | 9/2006 |
| KR | 100755775 | 9/2007 |
| KR | 1020090078620 | 7/2009 |
| KR | 1020090123776 | 12/2009 |
| KR | 1020110092833 | 8/2011 |
| KR | 101079838 | 11/2011 |

* cited by examiner

ELECTROMAGNETIC WAVE ABSORBING SHEET AND METHOD OF MANUFACTURING THE SAME AND ELECTRONIC DEVICE USING THE SAME

TECHNICAL FIELD

The present invention relates to an electromagnetic wave absorbing sheet and a method of manufacturing the same, and more particularly to an electromagnetic wave absorbing sheet which is thin and inexpensive, and has an excellent electromagnetic wave absorbing rate, a method of manufacturing the same, and an electronic device including the electromagnetic wave absorbing sheet.

BACKGROUND ART

In recent years, demand for high-speed signal processing, high function, miniaturization of a product, and reducing the thickness of a product shape in an electronic device circuit in association with digital electronic equipment, has been being accelerated. Data processing speeds of various types of semiconductor devices mounted on a printed circuit board (PCB) become high, and thus the component mounting density of active components and passive components mounted on the printed circuit board (PCB) is also going high.

Such components accompany a rapid change of the voltage and current by a high-speed signal, to thus generate inductive noise as a source of generating high frequency noise. These components such as active components and passive components are located very close together on a printed circuit having printed wires, to thereby cause crosstalk problems caused by electromagnetic coupling between internal components or between the components and the wires in small digital electronic devices, or radiate electromagnetic waves out of the small digital electronic devices to thereby cause EMI (ElectroMagnetic Interference: EMI) or electromagnetic wave interference problems which affect the other devices.

In addition, electromagnetic waves generated from electronic devices which are long-term exposed to the human body, may affect the human body, to thus cause diseases such as glaucoma, and reduction of fertility.

The electromagnetic shielding which is proposed as measures against EMI problems means that the electromagnetic noise generated from the inside of the electronic device is not radiated to the outside of the case, and also electromagnetic noise entering from the outside is absorbed or blocked.

In the case of digital electronic devices that have a spatial room in the inside of the digital electronic devices, EMI measures are taken as follows. Filters are connected to circuits which generate inductive noise, to thus remove the inductive noise or distances between the circuits get far away from each other, to thus prevent cross-talk problems caused by electromagnetic coupling between the circuits. In addition, the digital electronic devices are shielded with electromagnetic wave shielding materials to then be grounded.

However, since electronic components are mounted at a high density on printed circuit board (PCB) in the case of small digital electronic devices, the above-described measures against noise are not suitable as urgent measures against noise for products of a short product life. This is because mounting spaces are insufficient for mounting filters in the small digital electronic devices, and miniaturization and thinning should be taken in a design stage.

For this reason, recently, soft-magnetic composite magnetic body sheets of about 0.2 mm or more relatively thick, are used in input/output (I/O) ends, in order to inhibit inductive electromagnetic noise generated by active components that are major noise sources on the circuit boards of the small digital electronic devices.

The permeability of materials for the composite magnetic body sheets is composed of a real part permeability component and an imaginary part permeability component. A suppression efficiency of the noise becomes large as the permeability of the imaginary part in the electromagnetic noise frequency band gets large, and as the composite magnetic body gets thick.

Meanwhile, since the size of the digital electronic devices becomes more compact on trend, products having the thin composite magnetic body and the excellent suppression effect of the electromagnetic wave are required. In addition, in accordance with the above-mentioned miniaturization of the electronic devices, thinning of the composite magnetic body sheets for measures against noise used for a quasi-microwave band is required.

For the composite magnetic body sheets, the imaginary part permeability should become large in order to achieve thinning by using a noise reduction effect due to a magnetic loss. The current magnetic material has a problem that it does not meet the thinning and the conductive noise suppression effect, in a lower frequency band or a higher frequency band than about 10~100 MHz.

Korean Patent No. 10-0755775 disclosed a composite structure noise suppressing film and a method of manufacturing the same, in which in order to increase a reduction effect of electromagnetic waves even with a thin type having a thickness of about 25 to 100 μm, a plate-like resistance body powder and a plate-like soft-magnetic material powder are oriented in an insulating polymer matrix, to thus exhibit shape anisotropy, and to thereby provide an electromagnetic wave reduction effect by a resistance loss and a magnetic loss, and improve the electromagnetic wave reduction effect remarkably in frequencies of 1 GHz or above.

The Korean Patent No. 10-0755775 has a limit to reduce the thickness since a plate-like carbon powder that is a resistance body powder and a plate-like Sendust® powder that is a soft-magnetic material powder are oriented in an insulating polymer matrix, and has low imaginary part permeability because of the relatively low permeability when compared with those of different types of magnetic sheets, to thereby increase a sheet price because of the use of an expensive soft magnetic powder of a low absorbing rate.

In addition, in the case of a polymer magnetic sheet containing the soft-magnetic powder, and in the case of increasing the thickness of the sheet to improve the low magnetic permeability, the material cost is further increased with an increase in the thickness, and it is difficult to cope with the thinning tendency of mobile terminals. Furthermore, the noise suppressing film is commercially available as a thick film of 0.2 mm or above and thus has a limit in use.

Meanwhile, Korean Patent Laid-open Publication No. 10-2011-92833 proposed an electromagnetic wave absorbing sheet containing a Fe-based nanocrystalline soft-magnetic powder and a carbon-based conductive material powder. The Fe-based nanocrystalline soft-magnetic powder is formed of a Fe—Si—B—Nb—Cu-based alloy as an amorphous alloy. The Fe—Si—B—Nb—Cu-based alloy is preliminarily heat treated at a temperature of 350° C. to 500° C. for 45-90 minutes, to thus obtain alloy powders, the alloy powders are primarily and secondarily crushed, and then the crushed powders are meshed to be 270 mesh or less in particle size, to thereby obtain Fe-based nanocrystalline soft-magnetic powders having nano-sized crystal grains.

However, the electromagnetic wave absorbing sheet is a kind of a polymer sheet that is made to have a thickness of 0.5 mm by mixing a Fe-based nanocrystalline soft-magnetic powder having nano-sized crystal grains, with a binder. Accordingly, the electromagnetic wave absorbing sheet gets thick and also has the low magnetic permeability of the sheet due to the mixture of the binder.

Korean Patent Laid-open Publication No. 10-2005-37015 discloses a metal and polymer composite having a low frequency magnetic field shielding function, which includes at least one selected from Permalloy®, Sendust®, and a rapidly solidified alloy that are metal alloys having a low frequency high magnetic shielding function as a main component in one of a powder-like, flake-like, or fiber-like form, and a soft polymer material as a matrix in which a metal alloy is dispersed, and an additive which is used to composite the metal alloy and the soft polymer material. However, the sheet proposed in Korean Patent Laid-open Publication No. 10-2005-37015 is a kind of the polymer sheet, and has a low permeability problem.

Korean Patent Laid-open Publication No. 10-2003-86122 discloses a method of manufacturing an electromagnetic wave shielding material by using a metal foil ribbon of high magnetic permeability, the method including: preparing a metal foil ribbon in the range of 1 µm to 900 µm thick, and in the range of 1 mm to 90 mm wide, with a metal or alloy having a specific permeability of 1000 or more and selected from Ni—Fe—Mo, Fe—Si, and mu-metal by performing a quenching solidification method; annealing the metal foil ribbon in a temperature range of 700° C. to 1300° C. and under a hydrogen or vacuum atmosphere; and forming an adhesive layer on at least one surface of the metal foil ribbon.

Further, the electromagnetic wave shielding material manufacturing method further comprises forming a thin film layer of Cu, Ni, Ag, Al, Au, and Sn or a combination of these metals on at least one surface of the metal foil ribbon by electroplating or vacuum deposition.

However, the electromagnetic wave shielding material manufactured according to the Korean Patent Laid-open Publication No. 10-2003-86122 shield electromagnetic waves in a way of reflecting most of the electromagnetic waves by the metal foil ribbon and the metal film coated or vacuum deposited on the metal foil ribbon, but does not shield electromagnetic waves in a manner that absorbs the electromagnetic waves. As a result, when the electromagnetic shielding material is used in the inside of the electronic device, adjacent other circuit elements are affected by the electromagnetic wave reflected from the electromagnetic shielding materials.

In addition, Korean Patent Laid-open Publication No. 10-2009-123776 discloses a method of producing a conductive foam sheet which can be used as a material of an electromagnetic wave shielding gasket.

The conductive foam sheet for the electromagnetic wave shielding gasket includes: a foam sheet whose polarity is imparted by a coupling agent; a nickel plating layer formed on the foam sheet by 1000 Å to 3000 Å thick with an electroless plating method; and a copper plating layer formed on the nickel plating layer with a thickness of 0.5~3.0 µm under conditions of a current density of 1.3 to 5.0 A/dmin$^2$ by using an electrolytic plating method in which a surface resistance value is 0.02 to 0.08 Ω/square.

However, the above Korean Patent Laid-open Publication No. 10-2009-123776 shields electromagnetic waves in a way of reflecting most of the electromagnetic waves by the nickel and copper plating layers, but does not shield electromagnetic waves in a manner that absorbs the electromagnetic waves. As a result, when the conductive foam sheet is used in the inside of the electronic device, adjacent other circuit elements are affected by the electromagnetic wave reflected from the conductive foam sheet.

Korean Patent Laid-open Publication No. 10-2009-78620 discloses an electromagnetic wave shielding sheet formed of a substrate sheet formed of a synthetic resin film, and a metal deposition layer which is sputtered on a surface of the substrate sheet, in which the metal deposition layer includes at least one selected from the group consisting of copper (Cu), nickel (Ni), zinc (Zn), aluminum (Al) and manganese (Mn).

However, in the same manner as that of the Korean Patent Laid-open Publication No. 10-2009-123776, the electromagnetic wave shielding sheet disclosed in the Korean Patent Laid-open Publication No. 10-2009-78620 may cause a problem of affecting adjacent other circuit elements due to the electromagnetic wave reflected from the metal deposition layer.

Since the substrate sheet is formed of the synthetic resin film, the shielding sheet is thick and thus the overall thickness of the portable electronic device increases. As a result, in general, the mobile terminals seeking lightweight, thinning, shortening, and compactness may not use the shielding sheet when the thickness of the shielding sheet exceeds 0.5 mm.

Further, when depositing a conductive metal layer on a surface of the synthetic resin film, electromagnetic wave shielding performance may be reduced since the peeling of the conductive metal layer may occur.

DISCLOSURE

Technical Problem

To solve the above problems or defects, it is an object of the present invention to provide an electromagnetic wave absorbing sheet whose imaginary part permeability component is high in an electromagnetic wave noise frequency band of 300 MHz or higher by flake-processing an amorphous alloy ribbon to then be separated into a number of broken pieces, to thereby enable an excellent electromagnetic wave absorbing rate, a method of manufacturing the same, and an electronic device including the electromagnetic wave absorbing sheet.

It is another object of the present invention to provide an electromagnetic wave absorbing sheet which is a thin film and is made by using a simple manufacturing process, to thus achieve high productivity and low cost, and a method of manufacturing the same.

It is still another object of the invention to provide an electromagnetic wave absorbing sheet which can block a heat problem caused by eddy currents generated by an alternating-current magnetic field by reducing a surface area by flake-processing of a thin film magnetic sheet, and a method of manufacturing the same.

It is yet another object of the invention to provide an electromagnetic wave absorbing sheet which is made to be less than 300 µm thick and does not affect lightweight, thinning, shortening, and compactness of a portable electronic device although the electromagnetic wave absorbing sheet is applied to the portable electronic device, and a method of manufacturing the same.

Technical Solution

To accomplish the above and other objects of the present invention, according to an aspect of the present invention, there is provided an electromagnetic wave absorbing sheet comprising: at least one layer thin-film magnetic sheet which is separated into a plurality of broken pieces; a protective film that is adhered on one surface of the thin-film magnetic sheet; and a double-sided tape that is adhered on the other surface of the thin-film magnetic sheet.

Preferably but not necessarily, the thin-film magnetic sheet has an imaginary part permeability component of not less than 50 at 300 MHz.

Preferably but not necessarily, the thin-film magnetic sheet is made of a Fe-based amorphous alloy, a Co-based amorphous alloy or a nanocrystalline alloy.

Preferably but not necessarily, the thin-film magnetic sheet is made of an amorphous ribbon stacked in one to four layers, and an adhesive layer or double-sided tape is inserted between the stacked amorphous ribbons.

Preferably but not necessarily, a portion of a first adhesive layer provided on one face of the protective film and a portion of a second adhesive layer of the double-sided tape are filled into a gap between the broken pieces, to prevent water penetration.

Preferably but not necessarily, the amorphous ribbon is formed to have a thickness of 15 to 35 μm, and the broken pieces are formed of several micrometers (μm) to 3 mm in size.

Preferably but not necessarily, the electromagnetic wave absorbing sheet is made of a 30 μm to 300 μm thick, and is used in a frequency band of 400 MHz to 10 GHz, and a power loss which is defined as a ratio ($P_{loss}/P_{in}$) of lost power ($P_{loss}$) and input power ($P_{in}$) is not less than 60% in a frequency band of 1 GHz to 8 GHz.

According to another aspect of the present invention, there is also provided a method of manufacturing an electromagnetic wave absorbing sheet, the method comprising the steps of: forming a laminated sheet by attaching a protective film on which a first adhesive layer is formed on one side of a thin-film magnetic sheet, and attaching a double-sided tape on which a release film is adhered on the other surface of the thin-film magnetic sheet; separating the thin-film magnetic sheet into a number of broken pieces by flake-processing the laminated sheet; and flattening and slimming the laminated sheet by laminate-processing the flake-processed laminated sheet.

Advantageous Effects

As described above, an electromagnetic wave absorbing sheet according to the present invention has a high imaginary part permeability component in an electromagnetic wave noise frequency band of 300 MHz or higher by flake-processing an amorphous alloy ribbon to then be separated into a number of broken pieces, and thus enables an excellent electromagnetic wave absorbing rate.

As a result, the electromagnetic wave absorbing sheet according to the present invention absorbs electromagnetic waves generated from various components of an electronic device, to thereby block the electromagnetic waves from being influenced upon other components.

In addition, the electromagnetic wave absorbing sheet according to the present invention is a thin film below 300 μm thick and is made by using a simple manufacturing process, to thus achieve high productivity and low cost.

Further, the electromagnetic wave absorbing sheet according to the present invention is configured by flake-processing an amorphous alloy ribbon to thus be separated into a number of broken pieces, to thus increase a demagnetizing field to thereby remove a hysteresis loss, to thus heighten a uniformity of permeability of the electromagnetic wave absorbing sheet, and reduce a ribbon surface area to thereby increase the demagnetizing field so that magnetic saturation is not achieved, and to thus reduce a loss due to eddy currents to thereby minimize heat generation.

BEST MODE

The above and other objects, features, and advantages of the present invention can be appreciated by the following description and will be understood more clearly by embodiment of the present invention. In addition, it will be appreciated that the objects and advantages of the present invention will be easily realized by means shown in the appended patent claims, and combinations thereof. Accordingly, the technical spirit of the present invention can be easily implemented by one of ordinary skill in the art.

Further, if it is determined that the detailed description of the known art related to the present invention makes the gist of the present invention unnecessarily obscure, a detailed description thereof will be omitted.

Figure 1:
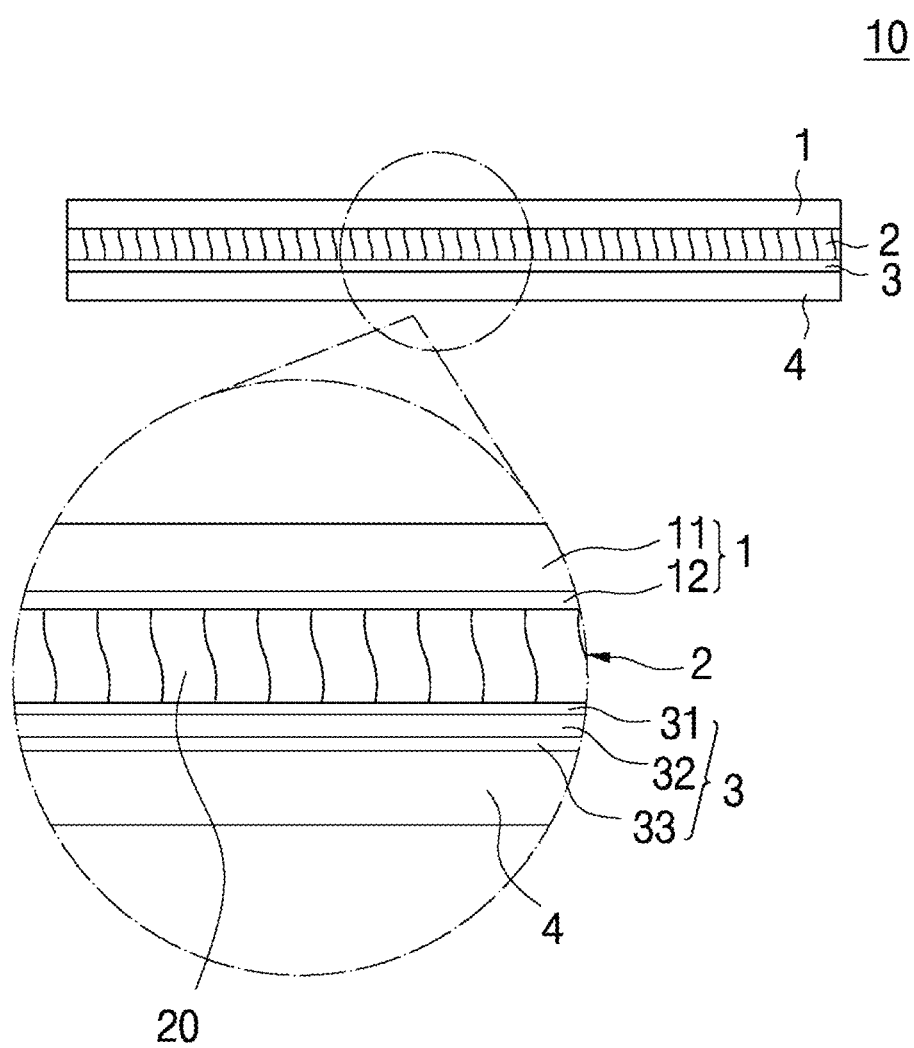
FIG. 1 is a cross-sectional view showing an electromagnetic wave absorbing sheet according to a first preferred embodiment of the present invention.
Figure 2:
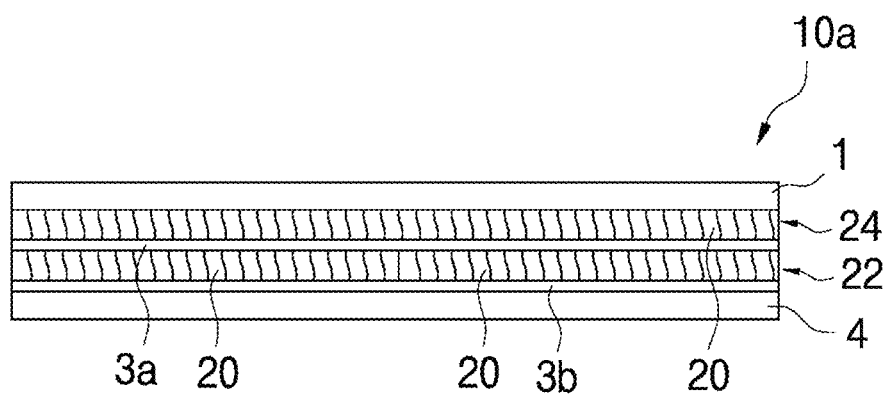
FIG. 2 is a cross-sectional view showing an electromagnetic wave absorbing sheet according to a second preferred embodiment of the present invention.
Figure 3:
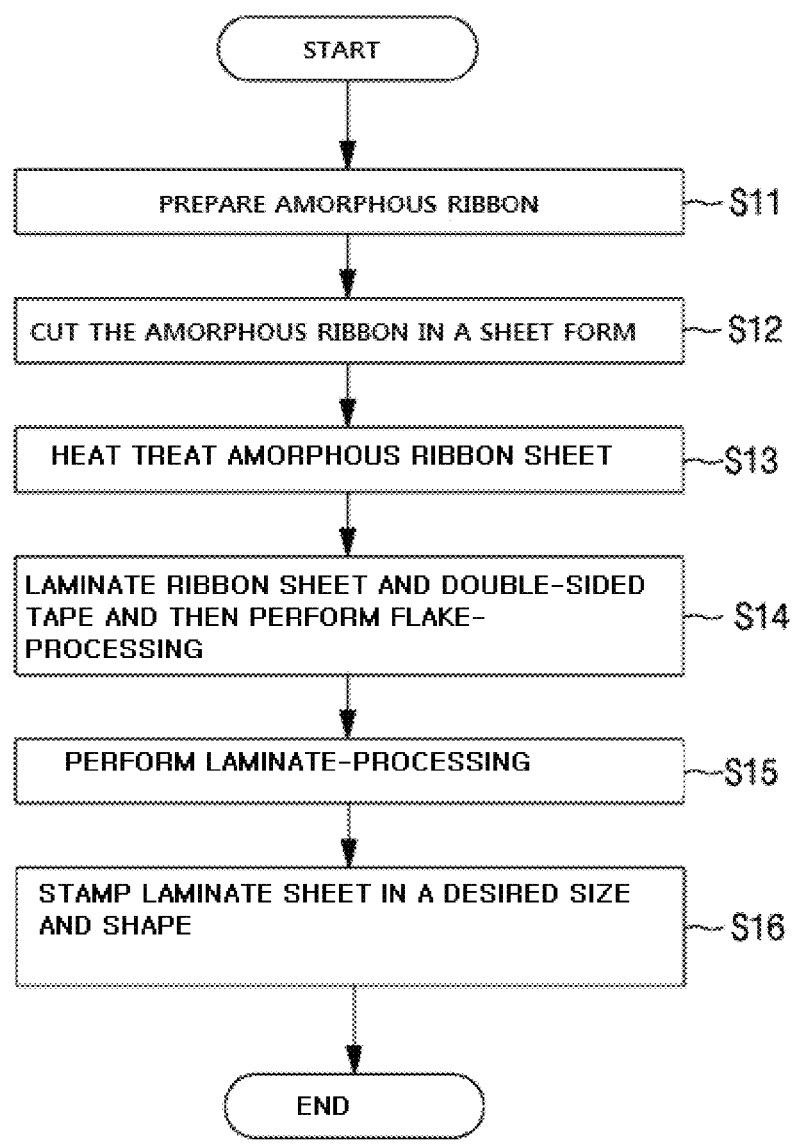
FIG. 3 is a flowchart view for describing a process of manufacturing an electromagnetic wave absorbing sheet according to the present invention.

FIG. 1 is a cross-sectional view showing an electromagnetic wave absorbing sheet according to a first preferred embodiment of the present invention. FIG. 2 is a cross-sectional view showing an electromagnetic wave absorbing sheet according to a second preferred embodiment of the present invention. FIG. 3 is a flowchart view for describing a process of manufacturing an electromagnetic wave absorbing sheet according to the present invention.

Referring to FIG. 1, an electromagnetic wave absorbing sheet 10 according to a first preferred embodiment of the present invention includes: at least one layer or a multi-layer thin-film magnetic sheet 2, by thermally treating an amorphous alloy ribbon or a nanocrystalline alloy ribbon, and then performing a flake-processing to be separated and/or cracked into a plurality of broken pieces 20; a protective film 1 that is adhered on an upper portion of the thin-film magnetic sheet 2; a double-sided tape 3 that is adhered on a lower portion of the thin-film magnetic sheet 2; and a release film 4 that is adhered on a lower portion of the double-sided tape 3.

The thin-film magnetic sheet 2 may be formed of, for example, a thin-film ribbon of an amorphous alloy or a nanocrystalline alloy.

The amorphous alloy may employ a Fe-based amorphous alloy or Co-based amorphous alloy; when considering the material cost, it is preferable to use the Fe-based amorphous alloy.

According to the present invention, a Fe—Si—B alloy, as needed, a Fe—Si—B—Co alloy can be used as the Fe-based amorphous alloy, and a Co—Fe—Ni—Si—B or Co—Fe—Cr—Si—B alloy can be used as the Co-based amorphous alloy.

For example, in the case of the Fe—Si—B alloy, it is preferable that Fe should be in the range of 70-90 atomic %, and the sum of Si and B should be in the range of 10-30 atomic %. The higher the content of a metal including Fe, the higher a saturation magnetic flux density becomes, but if the content of Fe is excessive, it is difficult to form an amorphous state. Thus, in the present invention, it is preferable that the content of Fe should be in the range of 70-90 atomic %. In addition, an amorphous state forming ability of the alloy is the most excellent when the range of the sum of Si and B is in the range of 10-30 atomic %. In order to prevent corrosion, a corrosion-resistant element such as Cr or Co may be also added to the basic composition within 20 atomic %, and a small amount of other metal elements necessary to impart different properties may be included in the basic composition.

For example, the Fe—Si—B alloy whose crystallization temperature is 508° C. and whose Curie temperature (Tc) is 399° C. can be used in the present invention. However, the crystallization temperature may be varied depending on the content of Si and B, or the other metal elements and the content thereof to be added in addition to a ternary alloy composition.

Meanwhile, an alloy satisfying the following Formula is preferably used as the nanocrystalline alloy.

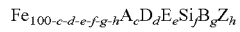

Formula

In the above Formula, an element A is at least one element selected from Cu and Au, an element D is at least one element selected from Ti, Zr, Hf, V, Nb, Ta, Cr, Mo, W, Ni, Co, and rare earth elements, an element E is at least one element selected from Mn, Al, Ga, Ge, In, Sn, and platinum group elements, an element Z is at least one element selected from C, N, and P, c, d, e, f, g, and h are numbers that satisfy the following relational inequalities $0.01 \leq c \leq 8$ at %, $0.01 \leq d \leq 10$ at %, $0 \leq e \leq 10$ at %, $10 \leq f \leq 25$ at %, $3 \leq g \leq 12$ at %, $15 \leq f+g+h \leq 35$ at %, respectively, and the alloy structure of an area ratio of 20% or more is formed of the fine structure of the particle size of equal to or less than 50 nm.

In the aforementioned Formula, the element A is used to enhance corrosion resistance of the alloy, to prevent coarsening of crystal grains and at the same time, to improve the magnetic properties such as the iron loss and the permeability of the alloy. When the content of the element A is too small, it is difficult to obtain the effect of suppressing coarsening of crystal grains. Conversely, when the content of the element A is excessively large, the magnetic properties are degraded.

Thus, it is preferable that the content of the element A is in the range from 0.01 to 8 at %. The element D is an element that is effective for the uniformity of the crystal grain diameter, the reduction of magnetostriction, etc. It is preferable that the content of the element D is in the range from 0.01 to 10 at %.

The element E is an element that is effective for the soft magnetic properties of the alloy and improvement of corrosion resistance of the alloy. The content of the element E is preferably not more than 10 at %. The elements Si and B are elements that make the alloy to become amorphous at the time of producing the magnetic sheet. It is preferable that the content of the element Si is in the range from 10 to 25 at %, and it is preferable that the content of the element B is in the range from 3 to 12 at %. In addition, it may include the element Z as an element that makes the alloy to become amorphous, other than Si and B. In that case, the total content of the elements Si, B and Z is preferably in the range of 15 to 35 at %. It is preferable to implement the microcrystalline structure that crystal grains whose grain diameters are in the range of 5 to 30 nm exist in the range of 50 to 90% as an area ratio in the alloy structure.

Further, a Fe—Si—B—Cu—Nb alloy can be used as a nanocrystalline magnetic alloy that is used in the nanocrystalline ribbon sheet 2, and in this case, it is preferable that the content of Fe is 73-80 at %/o, the content of the sum of Si and B is 15-26 at %/o, and the content of the sum of Cu and Nb is 1-5 at %. An amorphous alloy that is obtained by producing such a composition range in the form of a ribbon can be easily precipitated into nanocrystalline grains by a thermal treatment to be described later.

The protective film 1 may be implemented by using a resin film 11 of a fluorine resin-based film including a polyethylene terephthalate (PET) film, a polyimide film, a polyester film, polyphenylene sulfade (PPS) film, a polypropylene (PP) film, or poly terephthalate (PTFE), for example, of 1 to 50 μm thick. The protection film 1 is attached on one side of the thin-film magnetic sheet 2 through a first adhesive layer 12.

The double-sided tape 3 is formed of a base member 32 made of, for example, a PET (Polyethylene Terephthalate) film, on both sides of which second and third adhesive layers 31 and 33 are formed. A release film 4 is attached on the outer surface of the third adhesive layer 33.

The double-sided tape 3 may be a type of including a base member as described above, but may be a type of including no base member but being formed of only adhesive layers.

The first to third adhesive layers 12, 31, and 33 may be implemented by using, for example, acrylic adhesives, but may be of course possibly implemented by using different types of adhesives.

The thin-film magnetic sheet 2 that is used for the electromagnetic wave absorbing sheet 10 may have a thickness of 15 to 35 μm per one sheet, for example. In this case, in consideration of a handling process after the heat treatment of the thin-film magnetic sheet 2, a thickness of the thin-film magnetic sheet 2 is preferably set to be in the range of 25 to 30 μm. The thinner the thickness of the ribbon may become, a breakage phenomenon of the ribbon may occur due to even a little shock at the time of performing a handling process after the heat treatment.

Preferably, the broken pieces 20 of the amorphous ribbon are formed of several micrometers (μm) to 3 mm in size.

Further, the protective film 1 may be in the range of 10 to 30 μm, in thickness, and it is preferable to have a thickness of 20 μm. The double-sided tape 3 may have 10, 20, or 30 μm thick, preferably have a thickness of 10 μm. However, the protective film 1 and the double-sided tape 3 of the present invention are not limited thereto, but may employ a thick protection film of 50 to 100 μm, as needed.

As shown in FIG. 1, the electromagnetic wave absorbing sheet 10 according to the first embodiment is configured by using a single piece of the thin-film magnetic sheet 2, but, as shown in FIG. 2, may be configured by laminating two to four pieces of the thin-film magnetic sheets 22 and 24, to increase an electromagnetic wave absorption rate. In the case of laminating two to four pieces of the thin-film magnetic sheets 22 and 24, an adhesive layer or a double-sided tape is inserted between the laminated thin-film magnetic sheets 22 and 24, to block the broken pieces of the magnetic sheet from being dispersed during performing a flake-processing.

Referring to FIG. 2, the electromagnetic wave absorbing sheet 10a according to a second embodiment of the present invention is configured to include: thin-film magnetic sheets 22 and 24 of a two-layer structure; a fourth adhesive layer 3a inserted between the thin-film magnetic sheets 22 and 24; a protective film 1 which is attached on one side of the thin-film magnetic sheet 24; and a double-sided tape 3b and a release film 4 which are attached on one side of the thin-film magnetic sheet 22. It is possible to use a double-sided tape as the fourth adhesive layer 3a.

In the same manner as the first embodiment, the thin-film magnetic sheets 22 and 24 are configured by heat-treating an amorphous alloy ribbon or a nanocrystalline alloy ribbon, and then flake-processing the heat-treated ribbon, to then be separated and/or cracked into a number of broken pieces 20.

The thickness of the electromagnetic wave absorbing sheet according to the present invention is in a range of 30 to 300 μm, preferably is set to a range of 40 to 150 μm, and the use frequency band thereof is 400 MHz to 10 GHz. In this case, when the thickness of the absorbing sheet exceeds 500 μm, the absorbing sheet cannot be applied for a portable terminal device seeking a thinning trend.

Hereinafter, a method of manufacturing the magnetic field shield sheet 10 according to the embodiment of the present invention will be described with reference to FIG. 3.

First, an amorphous ribbon made of a nanocrystalline alloy or a nanocrystalline alloy is prepared by a rapidly solidification process (RSP) due to melt spinning (S11), and is cut in a predetermined length to then be laminated in a sheet form (S12) so that post-processing after a heat treatment can be easily performed.

In the case that the amorphous ribbon is made of an amorphous alloy, a Fe-based amorphous ribbon, for example, an ultra-thin amorphous ribbon equal to or less than 30 μm made of a Fe—Si—B alloy is prepared by a rapidly solidification process (RSP) due to melt spinning, and the stacked amorphous ribbon is heat-treated under the non-magnetic field condition in the temperature range of 300° C. to 600° C. for 30 minutes to 2 hours to obtain a desired permeability (S13).

In this case, according to the heat treatment atmosphere, since the heat treatment is performed in a temperature range so that oxidation does not occur, even though the Fe content of the amorphous ribbon is high, the heat treatment is not necessary to be made in an atmosphere furnace, but it may be sufficient to perform the heat treatment in the air. Further, even if the heat treatment takes place in an oxidizing atmosphere or a nitrogen atmosphere, the permeability of the amorphous ribbon is not substantially different at an identical temperature condition.

In the case that the heat treatment temperature is less than 300° C., stress relief of internal stress generated when preparing the magnetic sheet is not completely achieved, and thus non-uniformity of the magnetic properties such as magnetic permeability is not eliminated, to thereby cause a problem of lengthening the heat treatment time. In the case that the heat treatment temperature exceeds 600° C., crystallization is made abruptly inside the magnetic sheet by overheating and accordingly permeability is remarkably lowered, to thereby fail to exhibit desired permeability. In general, if the heat treatment temperature is low, it takes a long processing time, and reversely if the heat treatment temperature is high, the processing time is shortened.

In the case that the amorphous ribbon is made of a nanocrystalline alloy, a Fe-based amorphous ribbon, for example, an ultra-thin amorphous ribbon equal to or less than 30 μm made of a Fe—Si—B—Cu—Nb alloy is prepared by a rapidly solidification process (RSP) due to melt spinning, and the stacked amorphous ribbon is heat-treated under the non-magnetic field condition in the temperature range of 300° C. to 700° C. for 30 minutes to 2 hours to obtain a desired permeability (S13).

In this case, according to the heat treatment atmosphere, since the Fe content of the amorphous ribbon is 70 at % or more, if the heat treatment is performed in the air, oxidation may occur to cause an undesirable situation in terms of visual aspects. Thus, the heat treatment is preferably performed in a nitrogen atmosphere. However, even if the heat treatment is made under an oxidizing atmosphere, permeability of the nanocrystalline ribbon sheet has substantially no difference at the same temperature condition.

In the case that the heat treatment temperature is less than 300° C., the nanocrystalline grains are not sufficiently produced and thus a desired permeability is not obtained. In addition, it takes a longer time for the heat treatment. In addition, in the case of exceeding 700° C., the permeability is significantly lowered by an overheat treatment. Preferably, when the heat treatment temperature is low, it takes a long time for the heat treatment. In contrast, when the heat treatment temperature is high, the heat treatment time is shortened.

In addition, the amorphous ribbon is formed to have a thickness of 15 to 35 μm. The permeability of the amorphous ribbon increases in proportion to the thickness of the ribbon.

Further, after the amorphous ribbon is heat-treated, embrittlement becomes strong. Thus, when a flake-processing is executed in a subsequent step, the amorphous ribbon is easily flaked.

Subsequently, a flake-processing is performed with respect to one piece of the heat-treated amorphous ribbon or a multilayer, that is, two to four pieces of the heat-treated amorphous ribbons, at a state where a protective film 1 is attached on one side thereof, and a double-sided tape 3 attached with a release film 4 is attached on the other side thereof (S14). An adhesive layer or a double-sided tape is inserted between the stacked thin-film magnetic sheets 22 and 24.

Figure 4:
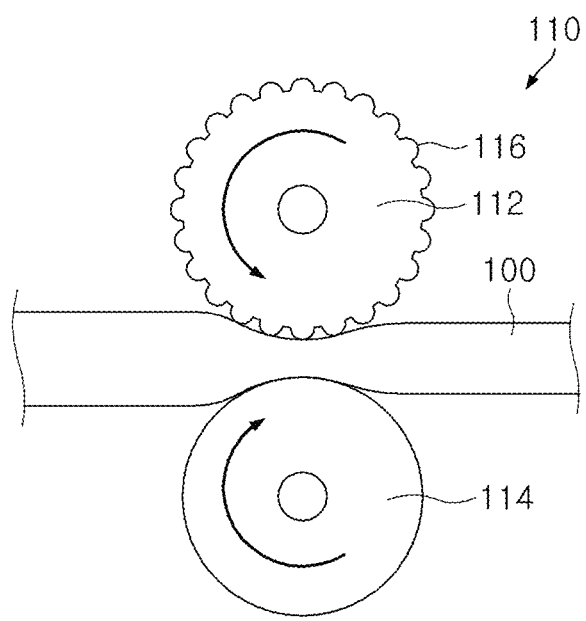
FIGS. 4 and 5 are cross-sectional views showing a flake-processing of a laminate sheet according to the present invention, respectively.
Figure 5:
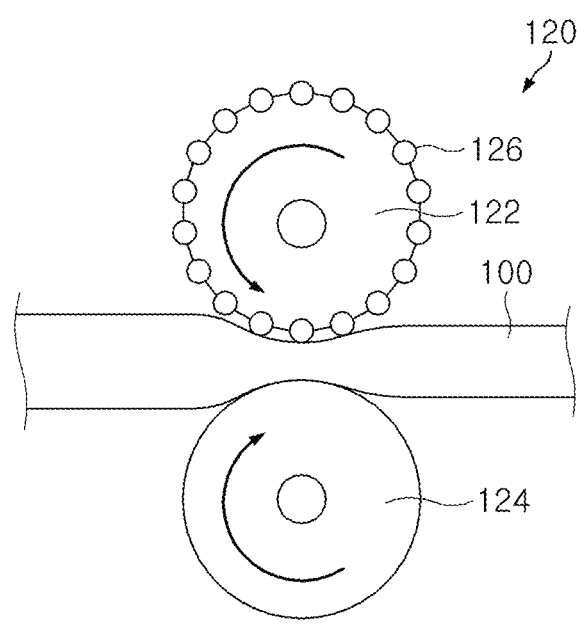

The flake-processing is executed by allowing the laminate sheet 100 that is obtained by sequentially stacking, for example, the protective film 1, the thin-film magnetic sheet 2 formed of the amorphous ribbon, the double-sided tape 3, and the release film 4, to pass through first and second flake devices 110 and 120 illustrated in FIGS. 4 and 5, to thereby separate the amorphous ribbon into a number of broken pieces 20. In this case, a plurality of the separated broken pieces 20 are maintained to keep a separated state by first and second adhesive layers 12 and 31 that are bonded to both sides of the amorphous ribbon 2a as shown in FIG. 6.

For example, as shown in FIG. 4, an available first flake device 110 may consist of a metal roller 112 on the outer surface of which a plurality of irregularities 116 are formed, and a rubber roller 114 that is disposed with a certain interval in opposition to the metal roller 112. As shown in FIG. 5, a second flake device 120 may be composed of a metal roller 122 on the outer surface of which a plurality of spherical balls 126 are mounted, and a rubber roller 124 that is disposed with a certain interval in opposition to the metal roller 122.

Figure 6:
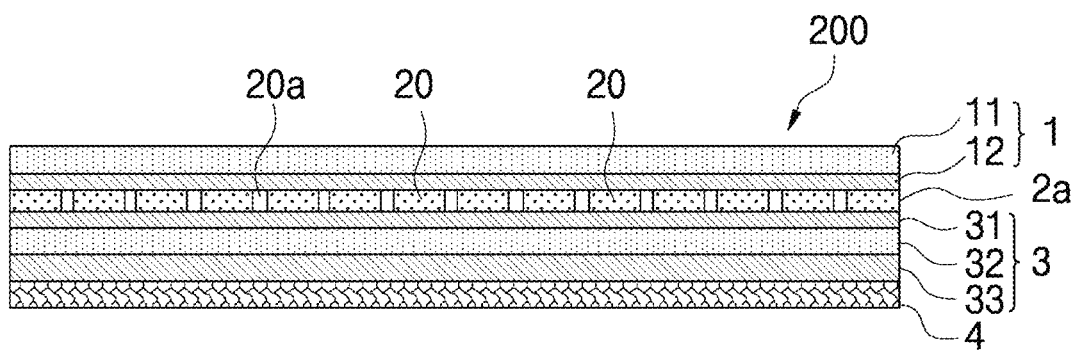
FIG. 6 is a cross-sectional view showing a state where a laminate sheet is flake-processed according to the present invention.

Thus, when the laminate sheet 100 is passed through the first and second flake devices 110 and 120, the amorphous ribbon 2a is separated into a number of the broken pieces 20 and gaps 20a are formed between the broken pieces 20, as shown in FIG. 6.

Since the broken pieces 20 of the amorphous ribbon 2a are formed to have a size of a range of several tens micrometers (μm) to 3 millimeters (mm), a demagnetizing field is made to increase to thereby remove a hysteresis loss and to thus heighten a uniformity of the permeability of the sheet.

Further, the flake-processing of the amorphous ribbon 2a may reduce the surface area of the ribbon and prevent a heat generation problem caused by an eddy current that is produced by an alternating-current magnetic field.

The flake-processed laminate sheet 200 has the gaps 20a between the broken pieces 20. Thus, when water is penetrated into the gaps 20a, the amorphous ribbon is oxidized and the appearance of the amorphous ribbon is poor and the shield performance is degraded.

Further, in the case that only a flake treatment process is performed, the broken pieces 20 are in contact with each other along the flow of the broken pieces 20, to accordingly increase the size of the broken pieces 20 and to thus cause a problem that the eddy-current loss increases.

Furthermore, the flake-processed laminate sheet 200 may have non-uniformity caused on the surface of the sheet during performing the flake-processing, and stabilization of the flake-processed ribbon is needed.

Thus, the flake-processed laminate sheet 200 undergoes a laminating process for flattening, slimming, and stabilization of the sheet 200, while simultaneously filling the adhesive into the gaps 20a between the broken pieces 20 (S15). As a result, water penetration is prevented.

Figure 7:
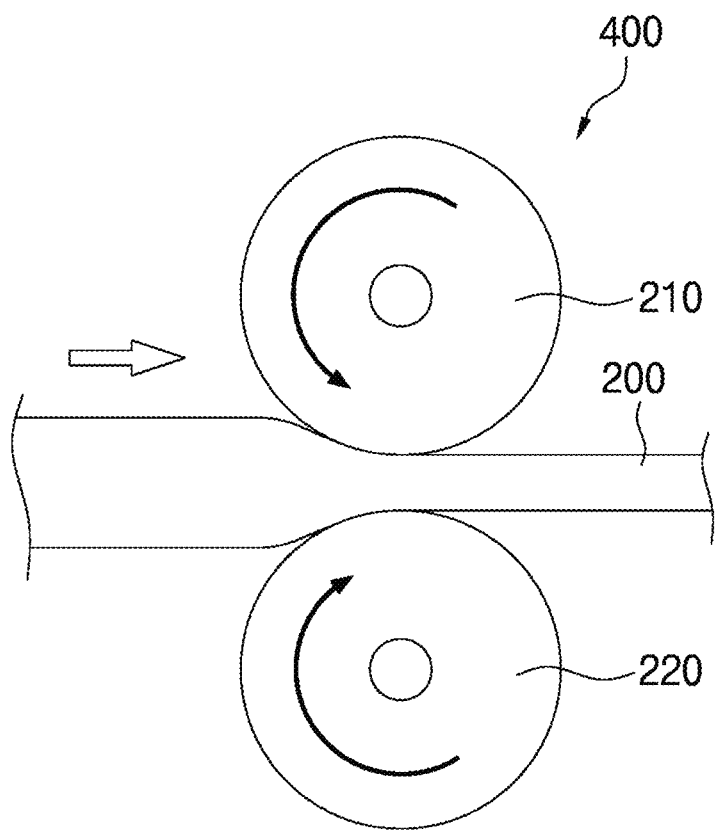
FIGS. 7 and 8 are cross-sectional views showing a laminate-processing of a flake-processed laminate sheet according to the present invention, respectively.
Figure 8:
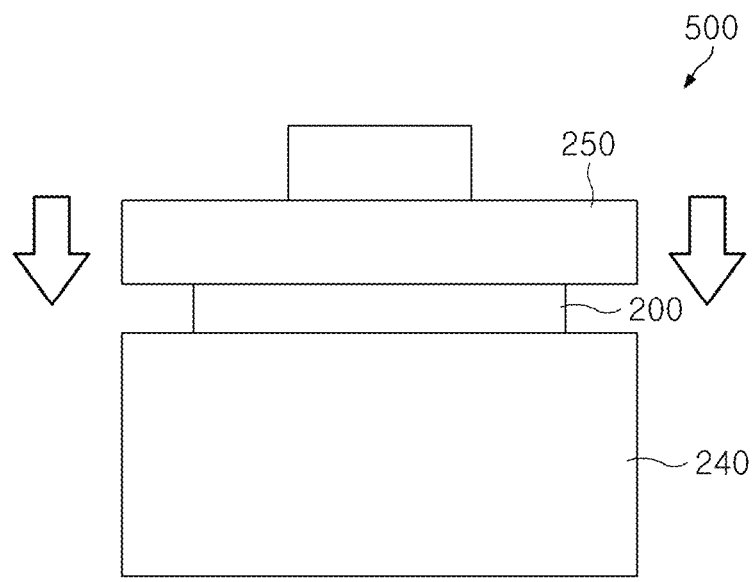

As shown in FIG. 7, a laminating device 400 for the laminating process may employ a roll press type including a first pressing roller 210 and a second pressing roller 220 that is disposed at a predetermined distance from the first pressing roller 210, between which the flake-processed laminate sheet 200 passes. As shown in FIG. 8, a laminating device 500 for the laminating process may employ a hydraulic press type including a lower pressing member 240 and an upper pressing member 250 that is vertically movably disposed on the upper side of the lower pressing member 240.

When the flake-processed laminate sheet 200 is heated at room temperature or at a temperature of 50° C. to 80° C., and then is passed through the laminating device 400 or 500, a first adhesive layer 12 of the protective film 1 is pressed, while some of the adhesive of the first adhesive layer 12 are introduced into the gaps 20a to seal the gaps 20a. Simultaneously, the double-sided tape 3 is pressed, while some of the adhesive of the second adhesive layer 31 are introduced into the gaps 20a to seal the gaps 20a.

Here, the first adhesive layer 12 and the second adhesive layer 31 may be formed by using an adhesive that can be deformed at the time of being pressed at room temperature, or may be formed by using a thermoplastic adhesive that can be thermally deformed by applied heat.

In addition, the first adhesive layer 12 and the second adhesive layer 31 preferably have a thickness of at least 50% when compared to the thickness of the amorphous ribbon so as to sufficiently fill the gaps 20a between the broken pieces 20.

Further, the interval between the first pressing roller 210 and the second pressing roller 220 and the interval between the upper pressing member 250 and the lower pressing member 240 when the upper pressing member 250 is in a lowered state, are preferably formed of a thickness of 50% or less when compared to the thickness of the laminate sheet 200, so that the adhesives of the first adhesive layer 12 and the second adhesive layer 31 can be introduced into the gaps 20a.

Any device of performing the pressing of the laminate sheets 100 and 200 and the flake-processing, can be used in the present invention.

Figure 9:
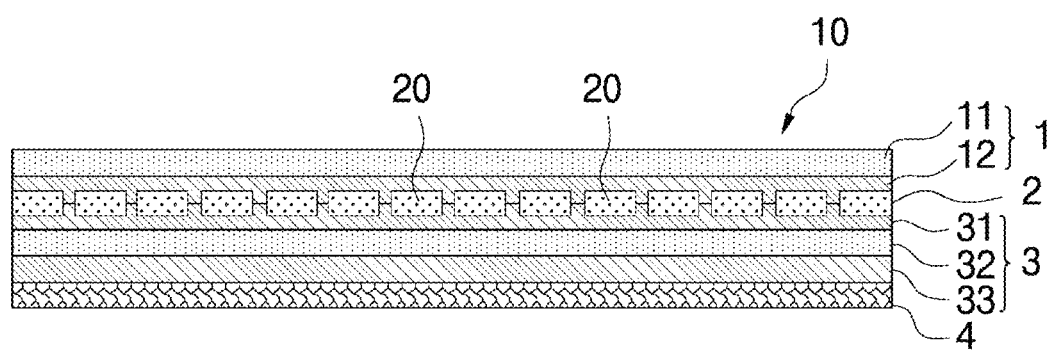
FIG. 9 is a cross-sectional view showing a state where the electromagnetic wave absorbing sheet according to the first embodiment of the present invention has been flake-treated and then laminated.

As shown in FIG. 9, when the laminating process is completed, an electromagnetic wave absorbing sheet 10 according to the present invention may have a structure that the first adhesive layer 12 and the second adhesive layer 31 partially fill the gaps 20a between the broken pieces 20 at a state where the amorphous ribbon 2a is separated into the broken pieces 20, to thereby prevent the oxidation of the amorphous ribbon 2a.

Finally, the electromagnetic wave absorbing sheet 10 having undergone the laminating process is stamped into the size and shape necessary for places and usage applied for electronic devices (S16).

Humidity Test

A humidity test was conducted for 120 hours at temperature of 85° C. and humidity of 85% with respect to the electromagnetic wave absorbing sheet 10 obtained in accordance with the invention and the laminate sheet 200 that has undergone the flake-processing but does not pass through the laminate-processing.

Figure 10A:
FIG. 10A is an enlarged photograph of the electromagnetic wave absorbing sheet that has not passed through a laminating process after having performed a flake-processing, but has undergone a humidity test.
Figure 10B:
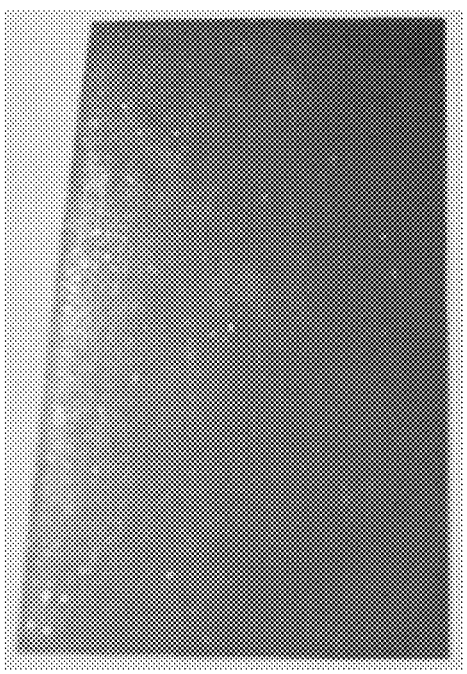
FIG. 10B is an enlarged photograph of the electromagnetic wave absorbing sheet that has passed through a laminating process after having performed a flake-processing and has undergone a humidity test, according to the present invention.
Figure 11A:
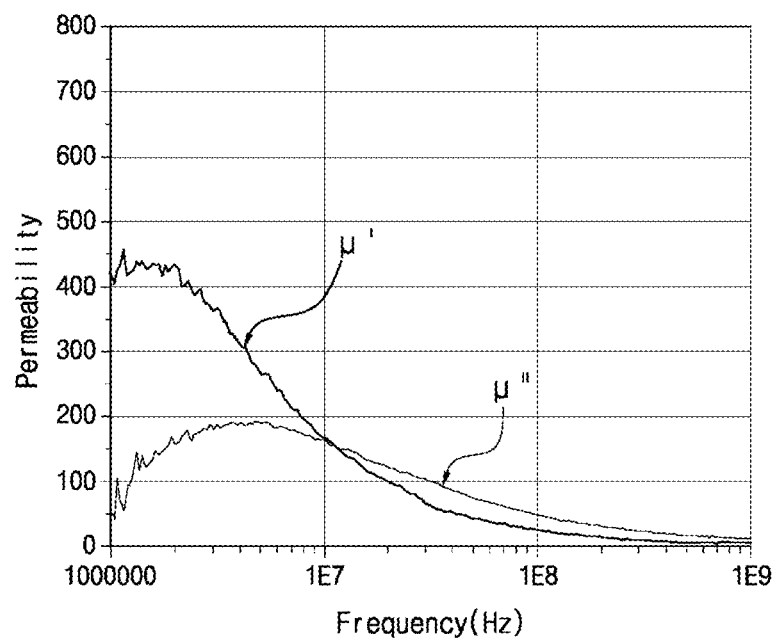
FIGS. 11A through 11E are graphs showing a change in permeability according to a change in a heat treatment temperature of a nanocrystalline ribbon sheet used for an electromagnetic wave absorbing sheet according to the present invention, respectively.
Figure 11B:
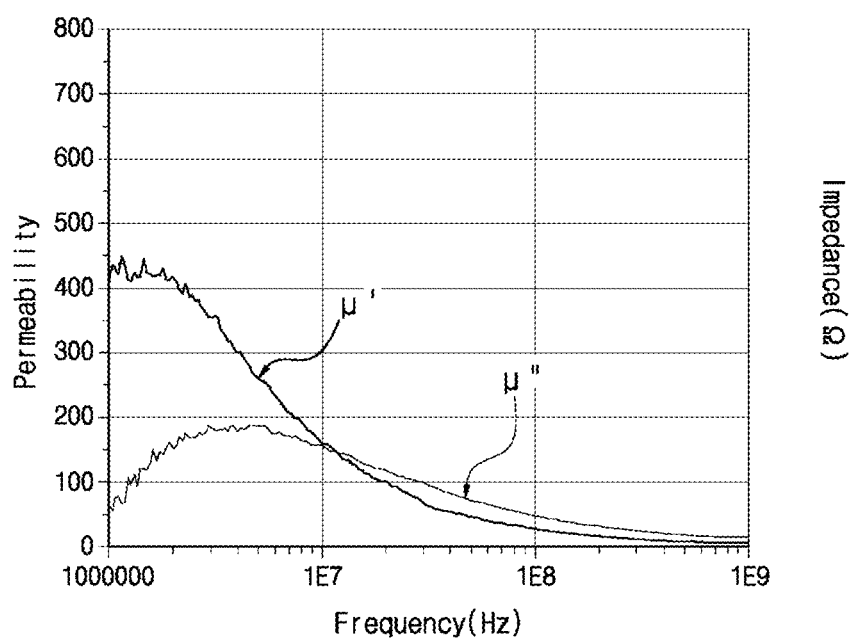
Figure 11C:
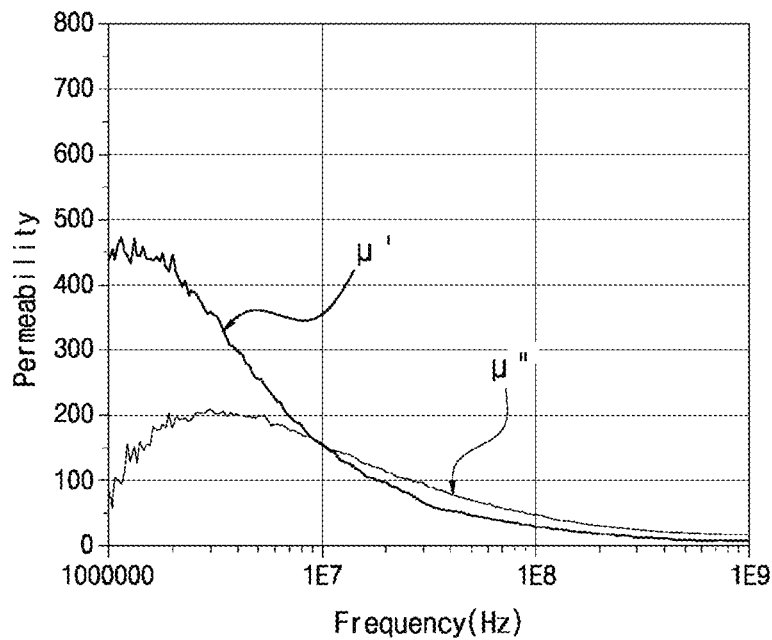
Figure 11D:
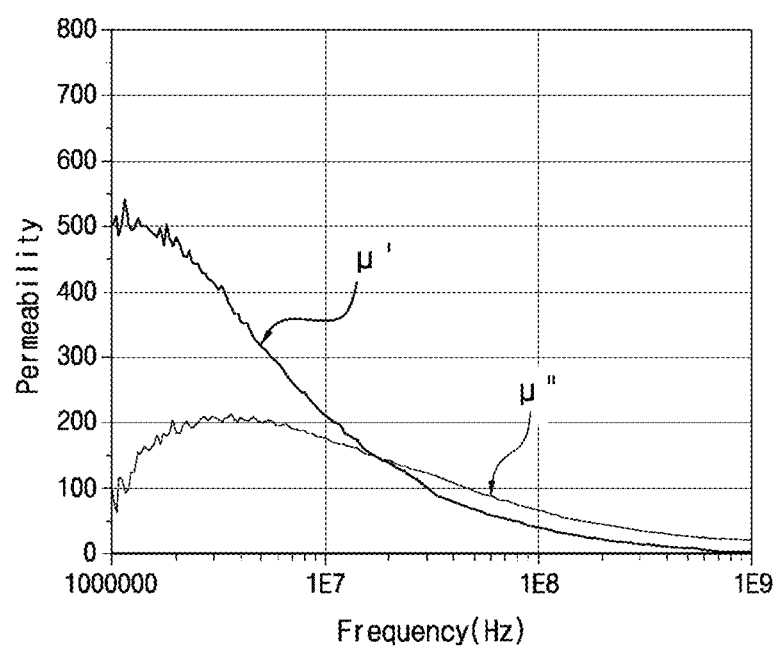
Figure 11E:
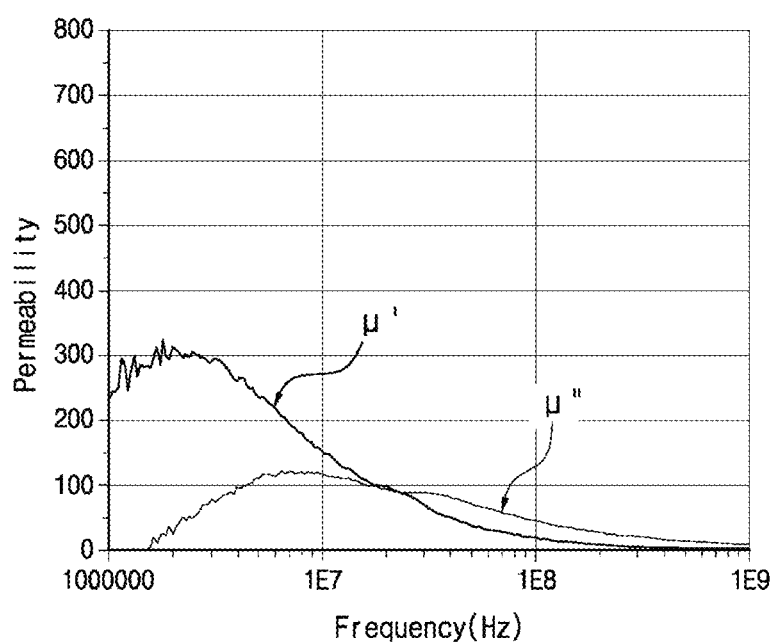

As a result, as shown in FIG. 10A, in the case of the laminate sheet 200 where only the flake-processing was executed, it can be seen that water was penetrated into the gaps between broken pieces when the amorphous ribbon was separated into a large number of broken pieces and then the amorphous ribbon was oxidized, and thus the appearance of the amorphous ribbon was changed. However, it can be seen that the electromagnetic wave absorbing sheet 10 in accordance with the present invention shows the appearance that does not change as shown in FIG. 10B.

Hereinafter, the present invention will be described in more detail through Examples. However, the following Examples are nothing but the illustration of the invention, and do not limit the scope of the invention.

Examples 1 to 7

Final samples (ARS1-320, ARS1-350, ARS1-400, ARS1-450, ARS1-500, ARS1-510, and ARS-600) of 40 μm thick of Examples 1 to 7 were prepared by comprising: making an amorphous ribbon made of a $Fe_{73.5}Cu_1Nb_3Si_{13.5}B_9$ alloy in a thickness of 25 μm by a rapid solidification method (RSP) due to melt spinning; cutting the amorphous ribbon in a sheet form and heat treating the cut sheet at 320° C., 350° C., 400° C., 450° C., 500° C., 510° C., and 600° C., respectively, under no magnetic field, in a nitrogen ($N_2$) atmosphere, for 1 hour, to thereby obtain an amorphous ribbon sheet; inserting the amorphous ribbon sheet between a protective film of 10 μm thick using a polyethylene terephthalate (PET) base member and a double-sided tape (with a release film excluded) of 10 μm thick using a PET base member, to thereby prepare a laminate sheet of 45 μm thick; and performing flake-processing and laminate-processing respectively by using a flake-processing device of FIG. 4 and a laminating device of FIG. 7.

Permeability values according to the frequency changes were obtained with the samples of Examples 2 to 5 and 7, which were illustrated in graphs of FIGS. 11A to 11E.

Figure 12:
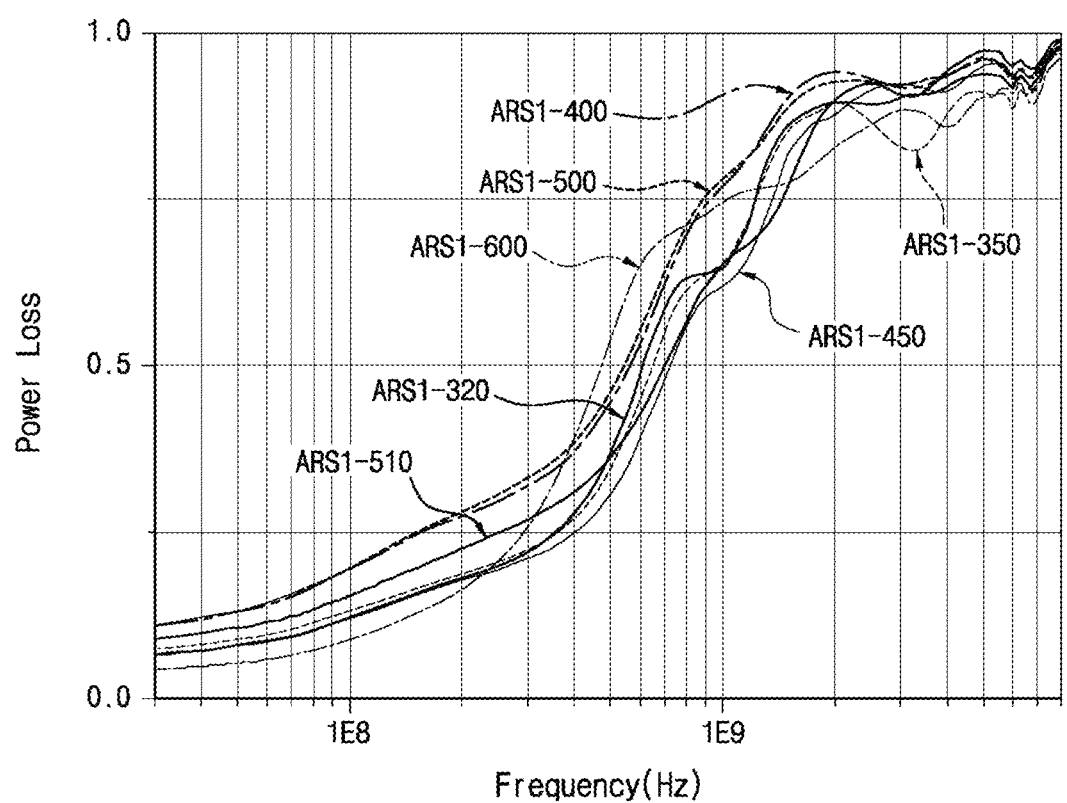
FIG. 12 is a graph showing a change in a power loss (an electromagnetic wave absorption rate), according to a change in a heat treatment temperature of a nanocrystalline ribbon sheet used for an electromagnetic wave absorbing sheet according to the present invention.
Figure 16:
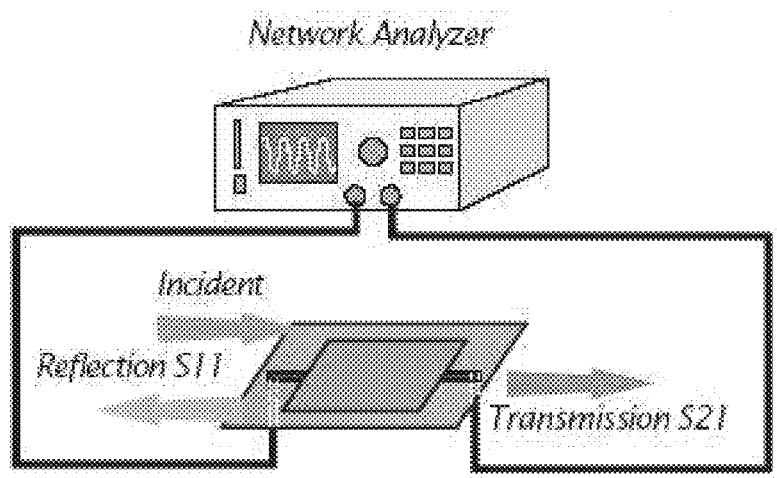
FIG. 16 is a diagram for explaining a method for measuring an electromagnetic wave absorption rate of an electromagnetic wave absorbing sheet according to the present invention.

In addition, power loss values were measured by using a micro-strip line method shown in FIG. 16, with the samples (ARS1-320, ARS1-350, ARS1-400, ARS1-450, ARS1-500, ARS1-510, and ARS-600) of Examples 1 to 7, which were illustrated in a graph of FIG. 12.

The electromagnetic wave absorbing rate of the electromagnetic wave absorbing sheet can be defined as a power loss as represented in the following Equation, in which the power loss is obtained as a ratio ($P_{loss}/P_{in}$) of lost power ($P_{loss}$) and input power ($P_{in}$).

$$\frac{P_{loss}}{P_{in}} = 1 - (|S_{11}|^2 + (|S_{21}|^2) \quad \text{Equation}$$

Here, $S_{11}$ denotes a reflection coefficient, and $S_{21}$ denotes a transmission coefficient.

In order to measure the reflection coefficient $S_{11}$ and the transmission coefficient $S_{21}$, samples of Examples 1 to 7 were mounted on a substrate on the input and output terminals of which Cu microstrip lines of 50Ω impedance are formed, respectively, and an input signal was applied to the input terminal of the microstrip line at a state where the input and output terminals of the microstrip line were connected to a network analyzer. Then, the reflection coefficient $S_{11}$ and the transmission coefficient $S_{21}$ were measured to then obtain a power loss by using the Equation.

First, referring to FIGS. 11A to 11E, it could be seen that the samples (ARS1-350, ARS1-400, ARS1-450, ARS1-500, and ARS-600) of Examples 2-5 and 7 had high imaginary part permeability μ" in an electromagnetic wave noise band of 400 MHz or higher, and thus had excellent electromagnetic wave absorbing rates. In particular, in the case of Example 4 having undergone the heat treatment for 1 hour at 500° C. as shown in 11D, the sample of Example 4 had a permeability of about 500 at 1 MHz, in which case the imaginary part permeability μ" was found to be highest as about 200 at 2 MHz.

In addition, the samples of Examples 2-5 and 7 were found to have the imaginary part permeability μ" of not less than about 70 at 300 MHz and thus it could be seen that it had excellent electromagnetic wave absorbing property.

In general, the permeability μ is represented as μ=μ'-iμ" and the imaginary part permeability μ" is a loss factor. It is preferable that the electromagnetic wave absorbing sheet has a large imaginary part permeability μ". Here, the real part permeability μ' is a factor representing magnetic properties.

Referring to the power loss graph according to the frequency changes shown in FIG. 12, the samples (ARS1-320, ARS1-350, ARS1-400, ARS1-450, ARS1-500, ARS1-510, and ARS-600) of Examples 1 to 7 according to the invention indicate the power loss of 25% to 37% in the electromagnetic wave noise frequency band of 400 MHz to 1 GHz, and 60% or higher in the electromagnetic wave noise frequency band of 1 GHz to 8 GHz, to thereby exhibit a high electromagnetic wave absorption rate.

Examples 8 to 11

Final samples (ARS2-454, ARS2-456, ARS2-457, and ARS2-459) of 40 μm thick of Examples 8 to 11 were prepared by comprising: making an amorphous ribbon made of a $Fe_{67}B_{14}Si_1Co_{18}$ alloy in a thickness of 25 μm by a rapid solidification method (RSP) due to melt spinning; cutting the amorphous ribbon in a sheet form and heat treating the cut sheet at 454° C., 456° C., 457° C., and 459° C., respectively, under no magnetic field, in a nitrogen ($N_2$) atmosphere, for 1 hour, to thereby prepare a laminate sheet of 45 μm thick in the same manner as the Example 1; and performing flake-processing and laminate-processing respectively.

Figure 13A:
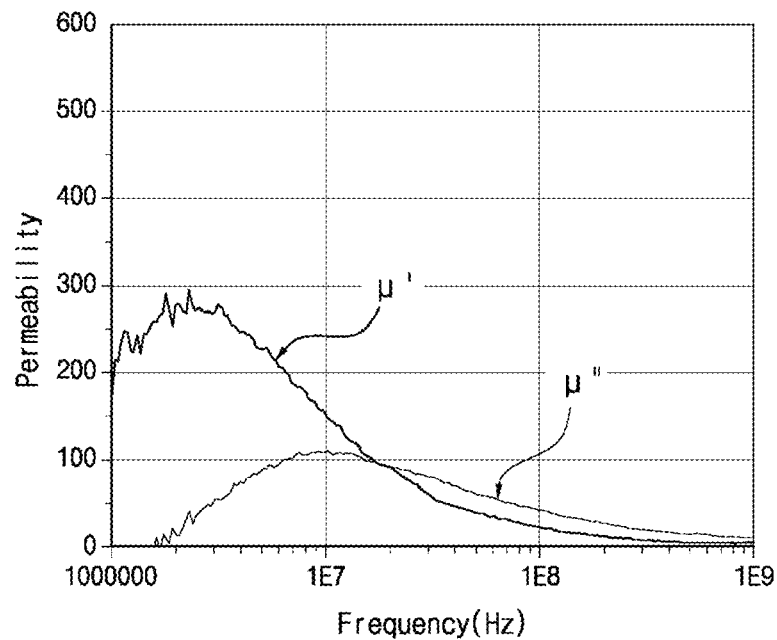
FIGS. 13A to 13C are graphs showing a change in permeability according to a change in a heat treatment temperature of a Fe-based ribbon sheet used for an electromagnetic wave absorbing sheet according to the present invention, respectively.
Figure 13B:
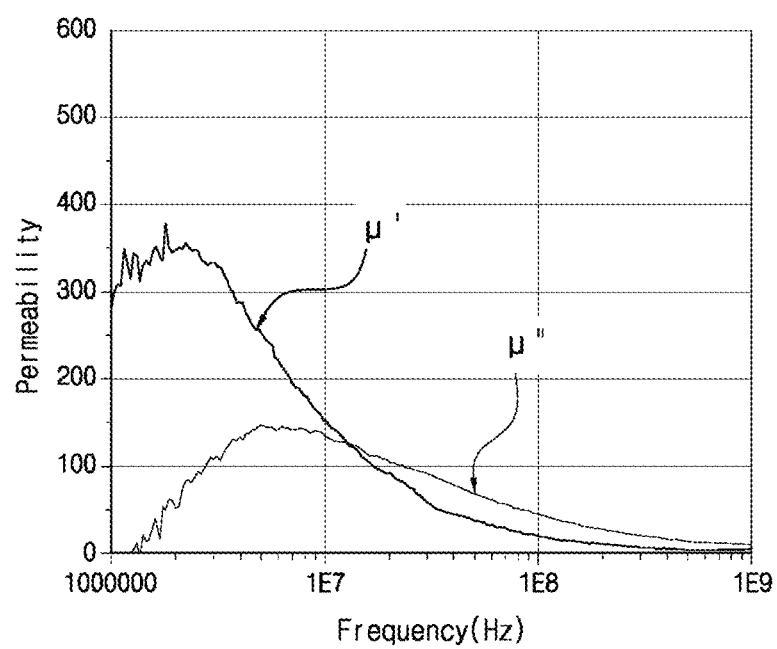
Figure 13C:
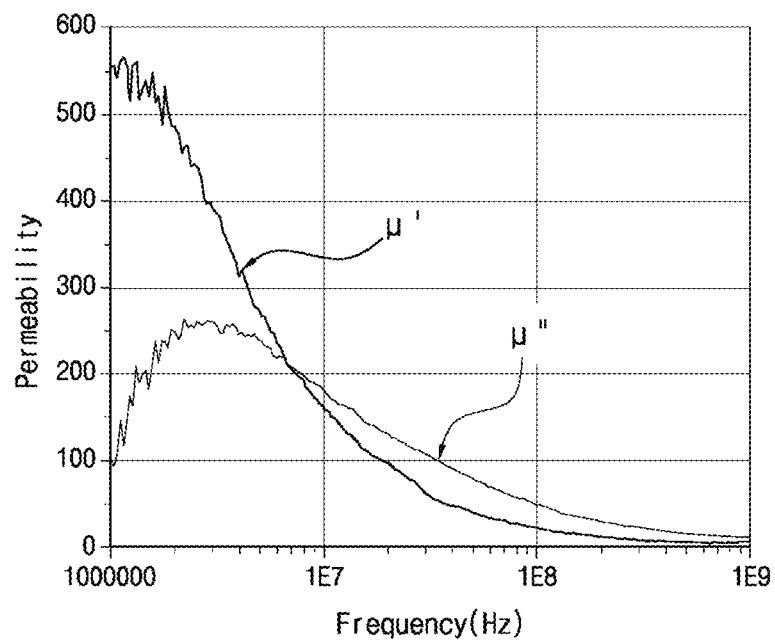

Permeability values according to the frequency changes were obtained with the samples of Examples 8 to 10, which were illustrated in graphs of FIGS. 13A to 13C.

Figure 14:
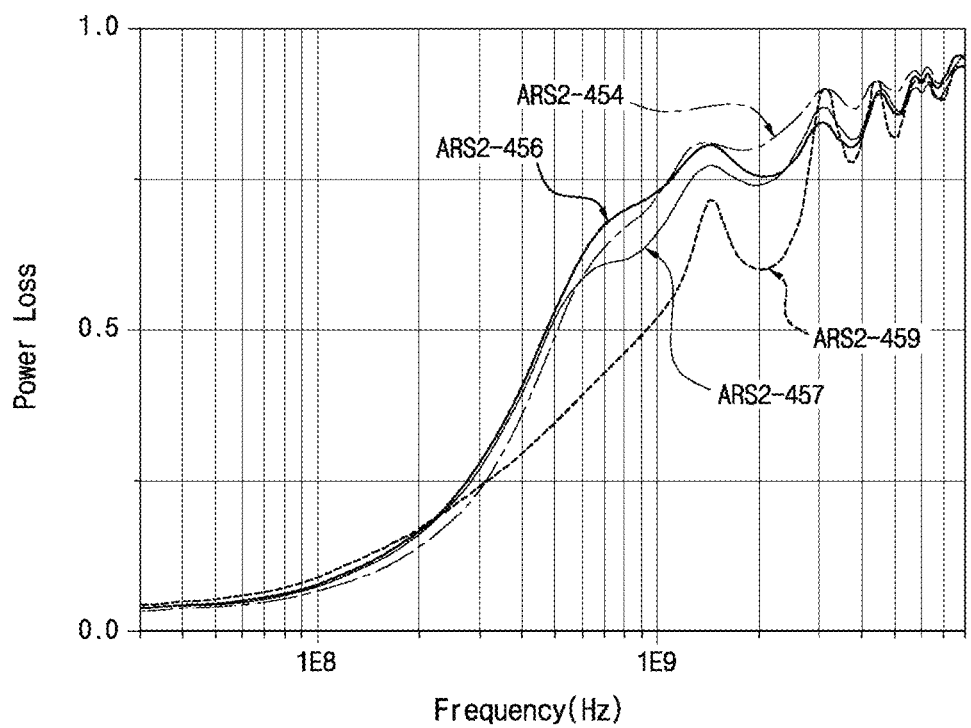
FIG. 14 is a graph showing a change in a power loss (an electromagnetic wave absorption rate), according to a change in a heat treatment temperature of a Fe-based ribbon sheet used for an electromagnetic wave absorbing sheet according to the present invention.

In addition, power loss values were measured by using a micro-strip line method shown in FIG. 16, with the samples of Examples 8 to 11, which were illustrated in a graph of FIG. 14.

The samples of Examples 8 to 11 using the amorphous ribbon made of the $Fe_{67}B_{14}Si_1Co_{18}$ alloy have the permeability similar to Examples 1 to 7. In addition, the samples of Examples 8 to 10 indicate the imaginary part permeability μ" appeared to be about 50 or more at 300 MHz, and thus it could be seen that it had very excellent electromagnetic wave absorbing property.

The samples of Examples 8 to 10 indicate the power loss of 30% to 40% in the electromagnetic wave noise frequency band of 400 MHz to 1 GHz, and 52% or higher in the electromagnetic wave noise frequency band of 1 GHz to 8 GHz, to thereby exhibit a high electromagnetic wave absorption rate. In particular, the samples (ARS2-454, ARS2-456, ARS2-457, and ARS2-459) of Examples 8 to 11 indicate the high power loss of 66% or higher in the electromagnetic wave noise frequency band of 1 GHz to 10 GHz, to thereby exhibit a high electromagnetic wave absorption rate.

Figure 15:
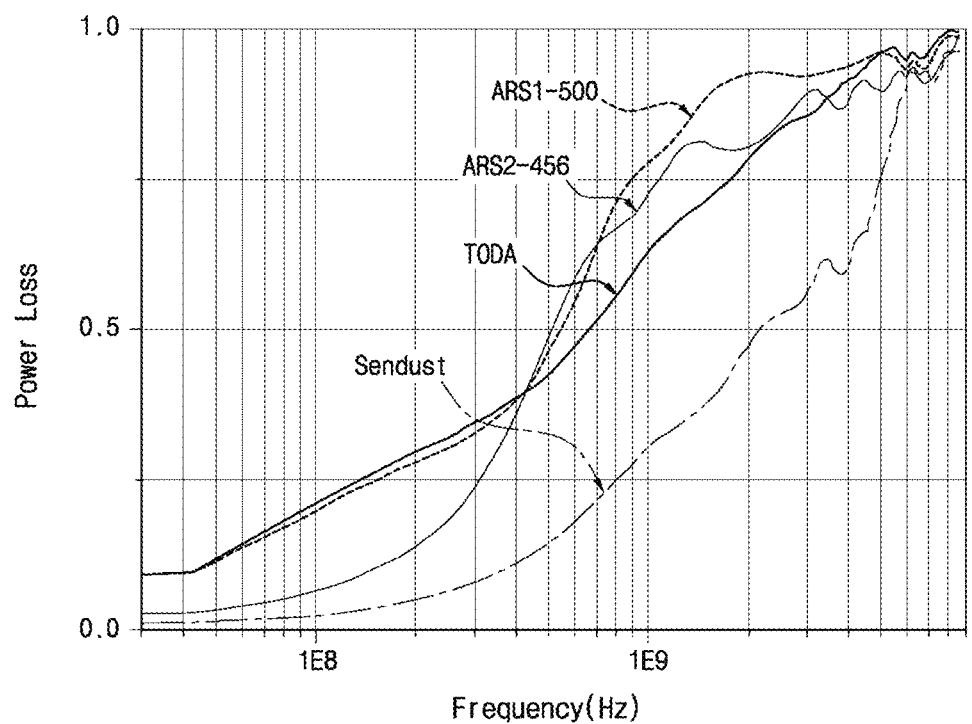
FIG. 15 is a graph showing a comparison result of comparing power losses between the electromagnetic wave absorbing sheet according to the invention, with an absorbing sheet according to a comparative example.

The sample (ARS1-500) of Example 6 using the amorphous ribbon made of the $Fe_{73.5}Cu_1Nb_3Si_{13.5}B_9$ alloy and the sample (ARS2-456) of Example 9 using the amorphous ribbon made of the $Fe_{67}B_{14}Si_1Co_{18}$ alloy were compared with an electromagnetic wave absorbing sheet of TODA KOGYO Co., and an electromagnetic wave absorbing sheet prepared by using a Sendust (Fe—Si—Al) alloy powder, as Comparison Examples 1 and 2, to thus measure a power loss due to a frequency change to then be indicated in a graph of FIG. 15.

As shown in FIG. 15, when Example 6 (ARS1-500) and Example 9 (ARS2-456) according to the present invention were compared with Comparison Examples 1 (TODA) and 2 (Sendust), the Examples 6 and 9 showed a superior power loss to Comparative Example 2 (Sendust), in all frequency bands, and showed a power loss characteristic equal to or higher than Comparative Example 1 (TODA) in the frequency of 400 MHz or higher.

As described above, the electromagnetic wave absorbing sheet according to the present invention is configured by flake-processing an amorphous alloy ribbon to then be separated into a number of fine pieces, to thereby exhibit a high imaginary part permeability component, and to thus enable an excellent electromagnetic wave absorbing rate in an electromagnetic wave noise frequency band of 400 MHz to 10 GHz in a thickness of 30 μm to 300 μm.

In the exemplary embodiments, the Fe-based amorphous ribbon whose price is cheap has been described as being used as a thin-film magnetic sheet, but an amorphous ribbon made of a different type of alloy such as Co-based amorphous alloy can be used as the thin-film magnetic sheet.

As described above, the present invention has been described with respect to particularly preferred embodiments. However, the present invention is not limited to the above embodiments, and it is possible for one who has an ordinary skill in the art to make various modifications and variations, without departing off the spirit of the present invention. Thus, the protective scope of the present invention is not defined within the detailed description thereof but is defined by the claims to be described later and the technical spirit of the present invention.

INDUSTRIAL APPLICABILITY

The present invention can be applied to electromagnetic wave absorbing sheets that block the effects influenced upon other elements by absorbing electromagnetic waves caused by radiation noise (AC magnetic fields) generated from IC chips, flat cables, PCB circuits, and battery packs for use in various electronic devices, and antennae for use in RFID and NFC, or DC magnetic fields generated from magnets for use in as speakers.

The invention claimed is:

1. An electromagnetic wave absorbing sheet comprising:
at least one layer thin-film magnetic sheet which is broken and separated into a plurality of broken pieces having gaps between the broken pieces by a flake-processing, the broken pieces having a size of no larger than 3 mm;
a protective film that is adhered on one surface of the thin-film magnetic sheet, wherein the protective film includes a first adhesive layer provided on the one surface of the thin-film magnetic sheet, and a portion of the first adhesive layer is filled into the gaps; and
a double-sided tape that is adhered on the other surface of the thin-film magnetic sheet, wherein the double-sided tape includes a second adhesive layer provided on the other surface of the thin-film magnetic sheet, and a portion of the second adhesive layer is filled into the gaps,
wherein the thin-film magnetic sheet has an imaginary part permeability component of not less than 50 at 300 MHz.

2. The electromagnetic wave absorbing sheet of claim 1, wherein the thin-film magnetic sheet is made of a Fe-based amorphous alloy, a Co-based amorphous alloy or a nanocrystalline alloy.

3. The electromagnetic wave absorbing sheet of claim 2, wherein the Fe-based amorphous alloy is formed of a Fe—Si—B or Fe—Si—B—Co alloy, and the nanocrystalline alloy is formed of a Fe—Si—B—Cu—Nb alloy.

4. The electromagnetic wave absorbing sheet of claim 1, wherein a heat treatment is performed in a range of 300° C. to 600° C. when the thin-film magnetic sheet is made of a Fe-based amorphous alloy.

5. The electromagnetic wave absorbing sheet of claim 1, wherein a heat treatment is performed in a range of 300° C. to 700° C. when the thin-film magnetic sheet is made of a nanocrystalline alloy.

6. The electromagnetic wave absorbing sheet of claim 1, wherein the thin-film magnetic sheet is made of an amorphous ribbon stacked in one to four layers.

7. The electromagnetic wave absorbing sheet of claim 1, wherein the thin-film magnetic sheet is made of an amorphous ribbon, and the amorphous ribbon is formed to have a thickness of 15 to 35 μm.

8. The electromagnetic wave absorbing sheet of claim 1, wherein the electromagnetic wave absorbing sheet is made of a 30 μm to 300 μm thick, and is used in a frequency band of 400 MHz to 10 GHz.

9. The electromagnetic wave absorbing sheet of claim 1, wherein a power loss which is defined as a ratio ($P_{loss}/P_{in}$) of lost power ($P_{loss}$) and input power ($P_{in}$) is not less than 60% in a frequency band of 1 GHz to 8 GHz.

10. A portable electronic device comprising the electromagnetic wave absorbing sheet according to claim 1.

* * * * *